United States Patent
McAdams

[11] Patent Number: 5,553,033
[45] Date of Patent: Sep. 3, 1996

[54] APPARATUS AND METHOD FOR AN ADDRESS TRANSITION DETECTOR SUMMING CIRCUIT

[75] Inventor: Hugh P. McAdams, McKinney, Tex.

[73] Assignee: Texas Instruments Incorporated, Dallas, Tex.

[21] Appl. No.: 320,615

[22] Filed: Oct. 7, 1994

[51] Int. Cl.$^6$ .............. G11C 7/00; H03K 3/017; H03K 3/00

[52] U.S. Cl. .............. 365/233.5; 365/194; 327/172; 327/176; 327/291; 327/293; 327/294

[58] Field of Search .............. 327/170, 172, 327/176, 291, 293, 294; 365/194, 230.01, 230.08, 233.5

[56] References Cited

U.S. PATENT DOCUMENTS

| | | | |
|---|---|---|---|
| 4,404,474 | 9/1983 | Dingwall | 327/170 |
| 4,583,008 | 4/1986 | Grugett | 327/172 |
| 5,306,963 | 4/1994 | Leak | 365/233.5 |
| 5,404,327 | 4/1995 | Houston | 365/233.5 |

Primary Examiner—David C. Nelms
Assistant Examiner—Trong Phan
Attorney, Agent, or Firm—William W. Holloway; Rich Donaldson; Leo Heiting

[57] ABSTRACT

In an address transition detection summing circuit, the varying address signal pulse widths can result in output signals from the address transition detection summing circuit which can compromise the performance of the associated memory circuitry. A parallel signal delay path, activated by the leading edge of the address signal, is incorporated in the address transition detection summing circuit and a logic ANDing element so that not only is the signal resulting from the trailing edge of the address signal applied to the logic ANDing element, but the trailing edge signal from the parallel signal delay path must be applied to the logic ANDing element before the trailing edge of the output pulse from the address transition detection summing circuit is generated. In the manner, an address transition always results in an output signal pulse having a preselected minimum width.

13 Claims, 2 Drawing Sheets

APPARATUS AND METHOD FOR AN ADDRESS TRANSITION DETECTOR SUMMING CIRCUIT

BACKGROUND OF THE INVENTION

1. Field of the Invention

This invention relates to semiconductor memory units and, more particularly, to circuits which detect transitions associated with address signals and generate output pulse signals controlling the activity associated with the addressing function. Based on the detected signals, these circuits generate resulting signals which determine the subsequent operation in the semiconductor memory unit.

2. Description of the Related Art

Referring to FIG. 1, an address transition detection summing circuit, according to the prior art, is shown. A control signal is applied through delay unit 11 and delay unit 12 to a first input terminal of logic NOR gate 13. Address signals are applied to the input terminal of summing network 10. In the summing network 10, the address signals are applied to the gate terminals of a series of transistors 102 through 104. The transistors 102 through 104 have one terminal coupled to ground and a second terminal coupled to both a load resistor 101 and the input terminal of inverting amplifier 105. The output terminal of inverting amplifier 105 is coupled to the output terminal of summing network 10. The output terminal of summing network 10 is coupled to a second input terminal of logic NOR gate 13. The output terminal of logic NOR gate 13 is applied through inverting amplifier 14 and inverting amplifier 15 to an output address signal terminal of the address transition detection summing circuit.

Referring to FIG. 2, the disadvantages associated with the use of the address transition detection summing circuit of FIG. 1 are illustrated. The curve labelled A in FIG. 2 is the leading edge of the address signal detected and processed by the address transition detection summing circuit. The detection circuitry generates a output signal pulse that has a leading edge developed when the leading edge of the address signal passes through the detection level (cf. FIG. 2) and the trailing edge of the output signal pulse is developed when the address signal passes through the detection level for a second time. In the typical address signal, the final portion of the address transition pulse is given by curve A(1). As will be clear from FIG. 2, the address transition detection summing circuit will result in a pulse having a total width of t2. The width of the pulse is determined by the width of the address signal plus a contribution having duration t3 resulting from the parameters of the summing network 10. However, should a "glitch" occur in an address signal and in the absence of applied simultaneous longer address signals, the trailing edges of the shorted address transition pulses can be represented by A(2) or A(3). As will be clear from FIG. 2, an address signal with a trailing edge A(2) will result in a pulse having a width of t1, while an address signal having a trailing edge A(3) will result in a pulse from the address transition detection circuit with a width of t0.

The summing circuit 10 (in FIG. 1) is generally referred to as a wired-OR summing circuit and is selected because of the relatively low number of transistors used in the implementation and the speed with which an output pulse is generated. When a "glitch" occurs, the output signals generated by the address transition detection summing circuit can be appreciably narrowed over the expected pulse. The output signals from the address detection transition circuit are used to precharge internal input/output lines. These input/output lines are typically heavily capacitively loaded when switching from one memory location to another. The output signal pulse width often controls the duration of the precharge during the memory location switching. This pulse width often controls the activation of intermediate input/output buffers as well, turning the buffers off while the equalization is accomplished and then reactivating the buffers once the new data has been placed on the input/output lines. The major disadvantage of this type of summing circuit is the susceptibility to output signal pulse width variations. The load resistor 101 in the summing circuit of FIG. 1 is included to reduce the variation in pulse width that occurs with metal-oxide-semiconductor transistor loads as a function of fabrication process variations, temperature variations, and operating conditions. However, the use of a load resistor does not eliminate the variation in the output signal that occurs as a result of the address signal pulse width variation. The width of the output signal pulses from the address transition detection summing circuit are a function of the amplitude and duration of the address signal "glitches". The narrow output pulse widths from the address transition detection summing circuit can cause a circuit malfunction due to inadequate input/output precharge and insufficient time to establish a proper signal level on the input/output lines before activation of the input/output amplifiers.

A need has therefore been felt for apparatus and a related method to insure that the output signal from the address transition detection summing circuit has a sufficient output signal pulse width to prevent a resulting circuit malfunction.

SUMMARY OF THE INVENTION

The aforementioned and other features are accomplished, according to the present invention, by an address transition detection summing circuit which provides output signal pulses having a minimum width. The address transition detection summing circuit provides a leading edge of a pulse which, except for circuit time delays, is coincident with the leading edge of the address signal. The leading edge of the address signal triggers a delay circuit which prevents the output signal from forming a trailing edge until after a predetermined period of time. The trailing edge of the output pulse from the address transition detection summing circuit therefore has a minimum pulse width determined by the delay circuit and, when the address signal is longer, the pulse width of the address detector summing network is determined by the address pulse.

These and other features of the present invention will be understood upon the reading of the following description in conjunction with the Figures.

DESCRIPTION OF THE PREFERRED EMBODIMENT

1. Detailed Description of the Drawings FIG. 1 and FIG. 2 have been described with respect to the related art.

Figure 1:
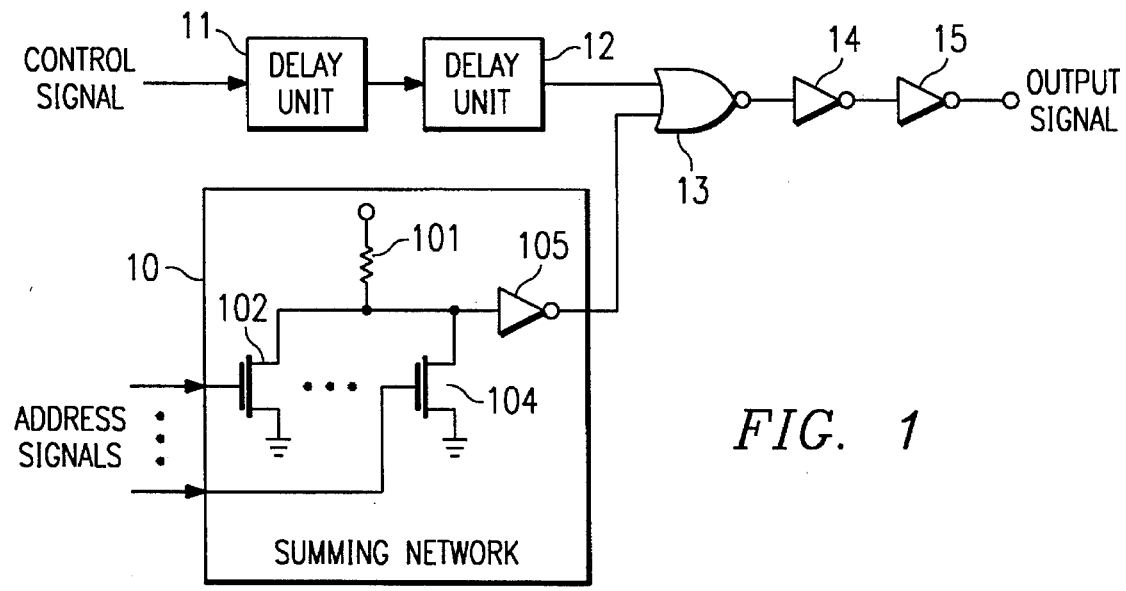
FIG. 1 is a block diagram of an address transition detection summing circuit according to the prior art.
Figure 2:
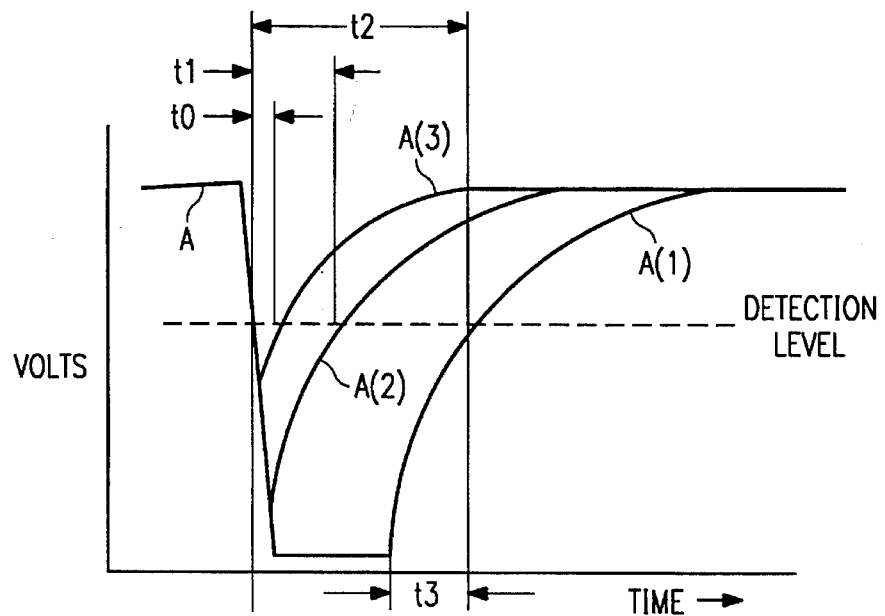
FIG. 2 illustrates waveforms associated with the address transition summing circuit of the prior art.
Figure 3:
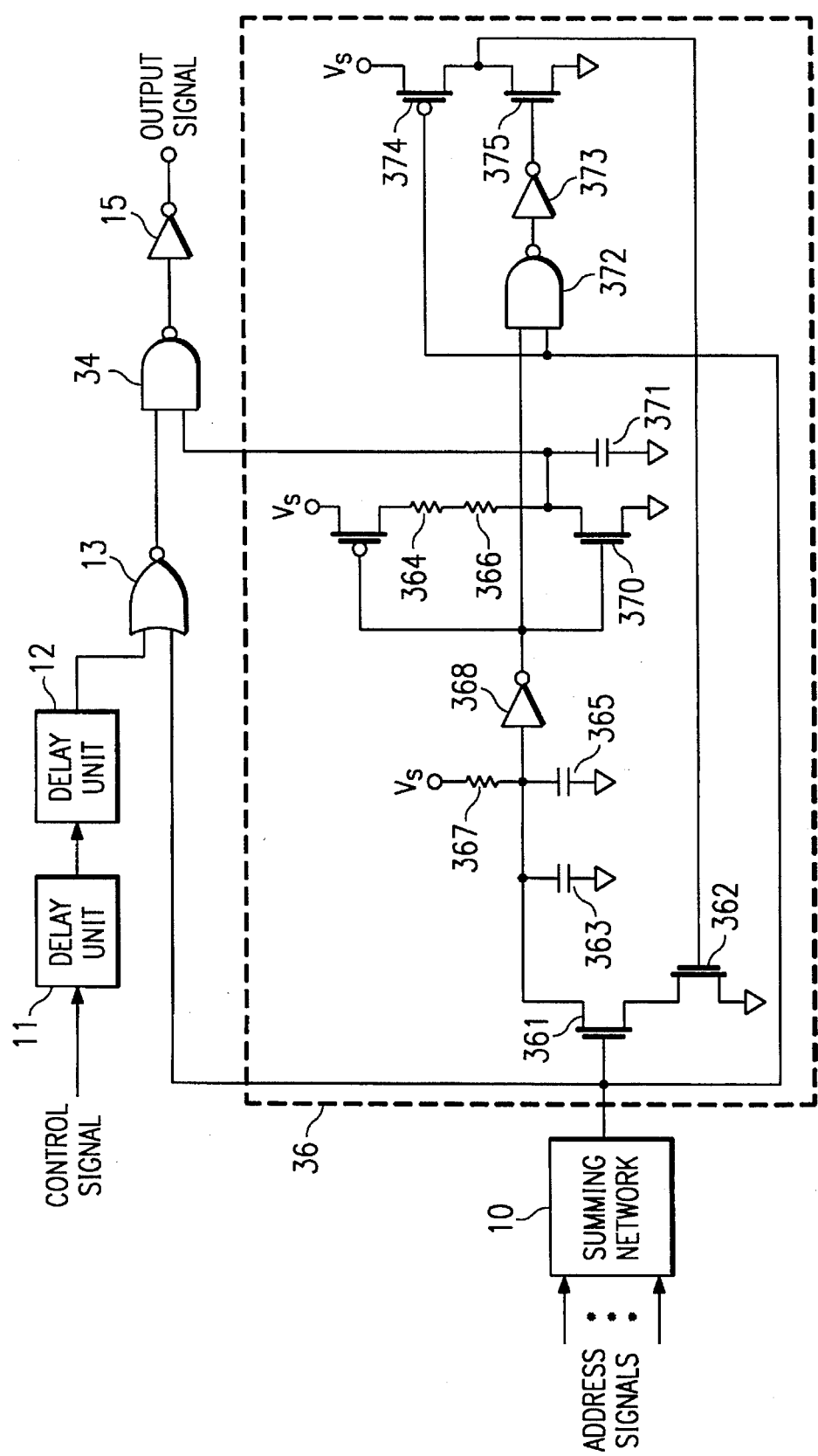
FIG. 3 is a block diagram of an address transition detection summing circuit according to the present invention.

Referring next to FIG. 3, a block diagram of the address transition detection summing circuit, according to the present invention, is shown. The block diagram is similar to the block diagram of the address transition detection summing circuit illustrated by FIG. 1 except that the inverting amplifier 14 of FIG. 1 is replaced by an logic NAND gate 34 and a transition delay circuit 36 has been added. In the preferred embodiment, the summing network 10 is a wired-OR network as shown in FIG. 1. The output terminal of summing network 10 is applied not only to the second input terminal of logic NAND gate 13, but also to the transition delay circuit 36. The output signal of transition delay circuit 36 is applied to the second input terminal of logic NAND gate 34, the first input terminal of logic NAND gate 34 being coupled to the output terminal of logic NOR gate 13. With reference to the transition delay circuit 36, the output terminal of summing network 10 is coupled to a gate terminal of n-channel transistor 361, to a second terminal of logic NAND gate 372, and to a gate terminal of p-channel transistor 374. The source terminal of transistor 361 is coupled to a drain terminal of n-channel transistor 362. The source terminal of transistor 362 is coupled to a ground terminal, while the gate terminal of transistor 362 is coupled to a drain terminal n-channel transistor 375 and a drain terminal of transistor 374. The source terminal of transistor 375 is coupled to the ground terminal. The source terminal of transistor 374 is coupled to the supply Vs. The drain terminal of transistor 361 is coupled through resistor 367 to supply terminal Vs, to a first terminal of element 363, to a first terminal of element 365 and to an input terminal of inverting amplifier 368. A second terminal of capacitor 363 is coupled to the ground terminal, while a second terminal of capacitor 365 is coupled to the ground terminal. An output terminal of inverting amplifier 368 is coupled to a first terminal of logic NAND gate 372, to a gate terminal of p-channel transistor 369, and to a gate terminal of n-channel transistor 370. The source terminal of transistor 369 is coupled to supply terminal Vs, while the drain terminal of transistor 369 is coupled through resistor 364 and resistor 366: to an input terminal of logic NAND gate 34, through capacitor 371 to a ground terminal, and through transistor 370 to the ground terminal.

2. Operation of the Preferred Embodiment

The operation of the preferred embodiment can be understood as follows. During the quiescent period, the input terminal to amplifier 105 is a high logic signal. As a result, the output terminal of inverting amplifier 105 low logic level and the output terminal of logic NOR gate 13 is a high logic level (the output of delay line 12 having a low logic level applied thereto). With the output of the inverting amplifier 105 (which is also the output terminal of the summing network 10) having a low logic signal applied thereto, then the input terminal of inverting amplifier 368 will have a high logic signal imposed thereon, the output terminal of inverting amplifier 368 will have a low logic signal imposed thereon, and the second input terminal of logic NAND gate 34 will have a high logic signal imposed thereon. Because the output terminal of the logic NOR gate 13 (and hence the first input terminal of logic NAND gate 34) has high logic signal imposed thereon, and the second input terminal of logic NAND gate has a high logic signal applied thereto, then the output terminal of logic NAND gate 34 (which is the input terminal of inverting amplifier 15) has low logic signal applied thereto, causing the output terminal of the inverting amplifier 15 to have high logic signal applied thereto. When an address transition signal occurs on one of the address transition detector input lines, then the output terminal of the address transition detection summing circuit 10 has a high logic signal applied thereto. Because the output terminal of the summing network 10 has a high signal applied thereto, the gate terminal of transistor 362 has a high logic signal applied thereto. Regardless of the duration of the address transition signal, transistors 361 and 362 are biased such that the input terminal to inverting amplifier 368 will have a low logic signal applied thereto, i.e., the capacitors 363 and 365 are discharged. Consequently, the output terminal of inverting amplifier 368 will have a high logic signal applied thereto. A high logic signal applied to the output terminal of inverting amplifier 368 and a high logic signal applied to the output terminal of summing network 10 forces a high logic signal to be applied to the output terminal of inverting amplifier 373 after a time delay due to the two intervening logic components. Thus, the gate terminal of transistor 362 has a low logic signal applied thereto soon after the discharge of capacitors 363 and 365, permitting the input terminal of inverting amplifier 368 to be raised to high logic signal by the charging of capacitors 363 and 365 through resistor 367. Resistor 367 and capacitors 363 and 365 are designed to have a time delay which replicates the contribution to the width of the typical output signal resulting from the parameters of the summing network 10 (i.e., t3 in FIG. 2). This RC time constant assures the delay from the output terminal of the summing network 10 to the output terminal of inverting amplifier 368 will have a contribution t3 (i.e., resulting from the parameters of the summing network 10), a contribution which will be included in the typical output signal pulse width t2. Once the input terminal of inverting amplifier 368 reaches a high enough value to cause the output terminal of inverting amplifier 368 to have a low logic signal applied thereto, the low logic signal applied to the output terminal of inverting amplifier 368 results in another time constant (RC) delay determined by the resistors 364 and 366 and capacitor 371. This RC time constant is intended to replicate the pulse width contribution to the output signal resulting from the address signal pulse width (i.e., t2–t3 in FIG. 2) for a typical address signal.

With the addition of the delay circuit 36 and associated components to the address transition detection circuit of FIG. 1, two parallel delay paths must time out and provide a signal before the address transition detection summing circuit can have a high logic signal. The output terminal of the summing network has a high logic signal applied thereto as a result of an address transition pulse from any address transition input signals. The logic AND function for these two delayed signals is provided by logic NAND gate 34. Thus even though the pulse at the output terminal of the summing network can be truncated as a result of short transient signals on the address transition line. The parallel delay path results in a stable output pulse.

While the invention has been described with particular reference to the preferred embodiment, it will be under stood by those skilled in the art that various changes may be made and equivalents substituted for elements of the preferred embodiment without departing from the invention. For example, the present invention has been described with particular reference to a variable pulse width for an address transition signal. However, the technique for insuring that an address signal with a varying pulse width can be processed in such a manner as to have a constant output pulse width can have wider application. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. An address transition detection summing circuit comprising:

a summing network coupled to a plurality of address lines, said summing network providing a summation signal which is a combination of address signals applied to said address lines, leading edge of said summation signal providing a leading edge of an output signal from said address transition detection summing circuit;

a delay network responsive to said leading edge of said summation signal for providing an extended signal; and a combining network responsive to a presence of both a trailing edge of said summation signal and a trailing edge of said extended signal for providing a trailing edge of said output signal, said output signal having a preferred signal width when said summation signal has a duration less than said preferred signal width, said output signal having a duration of said summation signal when said summation signal has a duration greater than said preferred signal width.

2. The address transition detection summing circuit of claim 1 wherein said summing network is a wired-OR summing network.

3. The address transition detection summing circuit of claim 2 wherein said combining network is a logic NAND gate, a first terminal of said logic NAND gate having trailing edge of said summation signal applied thereto, a second terminal of said logic NAND gate having said extended signal applied thereto.

4. The address transition detection summing circuit of claim 1 wherein said delay network includes:

a first delay network for providing an extended signal portion equal to a pulse width of a typical address signal; and a second delay network for providing an extended signal mortion equal to a time delay provided by said summing network.

5. A method for providing an output signal with a minimum width from an address transition detection summing circuit in response to at least one address signal applied to a plurality of address line, the method comprising the steps of:

generating a leading edge of said output signal from said address transition detection summing circuit from a leading edge of a summation signal resulting from at least one signal on said plurality of address lines;

generating a extended signal having a predetermined signal width with respect to said output pulse leading edge; and generating a trailing edge for said output signal when both a trailing edge of said summation address signal and said extended signal are present, wherein a duration of said output signal has said predetermined signal width when a duration of said summation signal is less than said predetermined signal width, a duration of said output signal having a signal width of said summation signal when a duration of said summation signal is greater than said predetermined signal width.

6. The method of claim 5 wherein said generating a extended signal step includes the step of initiating said extended signal by said leading edge of said summation signal.

7. The method of claim 6 further comprising the step of detecting a leading edge of said at least one address signal by voltage level detection in a wired-OR network, said wired-OR network providing an intermediate leading edge for determining said output signal leading edge and for initiating generation of said extended signal.

8. The method of claim 7 further comprising the step of detecting a trailing edge of said at least one address signal by voltage level detection in said wired-OR network, said wired-OR network generating a trailing edge for said summation signal, a presence of said summation signal trailing edge required to generate said output signal trailing edge.

9. The method of claim 5 wherein said step of generating a delayed signal includes the steps of:

generating a first portion of said extended signal determined by a pulse width of a typical address signal; and generating a second portion of said extended signal determined by the processing of said at least one address signal by said summing network.

10. An address transition detection summing circuit comprising:

a summing network coupled to a plurality of address lines and responsive to at least one address signal, said summing network combining address signals to provide a summation signal;

a delay network responsive to a leading edge of said summation signal for providing extended signal having a duration of a preselected value; and an output network responsive to a leading edge of said summation signal for providing a leading edge of an output signal for said address transition detection summing circuit, said output network responsive to a trailing edge of said summation signal in conjunction with said extended signal for providing a trailing edge of said output signal from said address transition detection summing circuit, said output signal having duration of said preselected value when said summation signal has a duration less than said preselected value, said output signal having a duration of said summation signal when said summation signal has a duration greater than said preselected value.

11. The circuit of claim 10 wherein said summing network is a wired-OR summing network.

12. The circuit of claim 11 wherein said output network includes a logic AND gate coupled to said delay network and to said summing network for continuing said output signal in the event of a simultaneous presence of said extended signal and said summation signal trailing edge.

13. The circuit of claim 12 wherein said delay network includes:

a first delay network providing an extended signal portion equal to the a typical signal duration of an address signal; and a second delay network providing an extended signal portion equal to a delay resulting from said summing network.

* * * * *